(12) United States Patent
Preikszas (10) Patent No.: US 10,062,542 B2
(45) Date of Patent: Aug. 28, 2018

(54) PARTICLE BEAM MICROSCOPE AND METHOD FOR OPERATING A PARTICLE BEAM MICROSCOPE

(71) Applicant: Carl Zeiss Microscopy GmbH, Jena (DE)

(72) Inventor: Dirk Preikszas, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/010,046

(22) Filed: Jan. 29, 2016

(65) Prior Publication Data
US 2016/0225578 A1  Aug. 4, 2016

(30) Foreign Application Priority Data
Feb. 2, 2015  (DE) ........................ 10 2015 001 297

(51) Int. Cl.
*H01J 37/28* (2006.01)
*H01J 37/21* (2006.01)

(52) U.S. Cl.
CPC .............. *H01J 37/21* (2013.01); *H01J 37/28* (2013.01)

(58) Field of Classification Search
CPC ................................ H01J 37/21; H01J 37/263
See application file for complete search history.

(56) References Cited

U.S. PATENT DOCUMENTS

| | | | |
|---|---|---|---|
| 5,264,703 A * | 11/1993 | Shibano | H01J 37/21 250/310 |
| 6,521,891 B1 | 2/2003 | Dotan et al. | |
| 6,653,632 B2 | 11/2003 | Kazumori | |
| 6,664,546 B1 | 12/2003 | McCord et al. | |
| 7,161,158 B2 | 1/2007 | Shemesh et al. | |
| 2006/0278826 A1 * | 12/2006 | Roberts | H01J 37/222 250/310 |
| 2008/0093551 A1 * | 4/2008 | Tsuneta | G06T 5/006 250/310 |

OTHER PUBLICATIONS

Y. Ose et al., "Improved CD-SEM Optics with Retarding and Boosting Electric Fields", Microlithography '99, International Society for Optics and Photonics, 1999, pp. 930-939.
German Office Action, with translation thereof, for corresponding DE application No. 10 2015 001 297.5, dated Oct. 23, 2015.

* cited by examiner

*Primary Examiner* — Eliza Osenbaugh-Stewar
(74) *Attorney, Agent, or Firm* — Fish & Richardson P.C.

(57) ABSTRACT

A method for operating a particle beam microscope includes: setting potentials of a particle source and an object; directing a particle beam onto the object; setting an excitation of a particle-optical lens; generating a dependence between a manipulated variable and the excitation so that the excitation is representable as a monotonic function dependent on the manipulated variable; changing the manipulated variable via an actuating element to focus the particle beam at the object; and determining a target value of the manipulated variable in a manner dependent on the set potentials. The target value virtually corresponds to an ideal excitation of the lens. The particle beam in the case of the ideal excitation is focused at the object. The absolute value of the first derivative of the function in a value range containing the target value is less than in the case of values lying outside of this value range.

20 Claims, 4 Drawing Sheets

PARTICLE BEAM MICROSCOPE AND METHOD FOR OPERATING A PARTICLE BEAM MICROSCOPE

CROSS-REFERENCE TO RELATED APPLICATION

The application claims benefit under 35 U.S.C. § 119 of German Patent Application Serial No. 10 2015 001 297.5, filed Feb. 2, 2015, the entire contents of which are incorporated by reference herein.

FIELD

The present disclosure relates to particle beam microscopes and to methods for operating particle beam microscopes. In particular, the disclosure relates to those particle beam microscopes and methods, in which a particle beam is focused at an object to be examined.

BACKGROUND

An example of a particle beam microscope is a scanning electron microscope, in which a focused electron beam is scanned over an object to be examined and secondary electrons or backscattered electrons, generated by the incident electron beam at the object, are detected in a manner dependent on the deflection of the focused particle beam in order to generate an electron-microscopic image of the object.

The particle beam is generated by a particle source and accelerated, it possibly passes through a condenser lens and it is focused at the object by an objective lens. In order to obtain a high spatial resolution of the particle beam microscope, the particle beam is focused to the best possible extent at the object, i.e. a region illuminated by the focused particle beam at the surface of the object ("beam spot") should be as small as possible. In practice, this is achieved by virtue of a user setting the focusing of the particle beam by hand by actuating an actuating element, such as a focus adjustment wheel, and the controller of the particle beam microscope changing the excitation of the objective lens in a manner dependent on the actuation of the actuating element. During this adjustment process, the particle beam is scanned continuously over the object in order to record images. The user can assess the quality of the current images and, in a manner dependent thereon, actuate the actuating element until he is satisfied with the quality of the images or he can no longer improve the quality thereof. Then, within the meaning of the assessment of the quality of the images carried out by the user, the particle beam is focused to the best possible extent. However, this process is also time-consuming.

The kinetic energy with which the particles are incident on the object is given by the difference between the electric potential of the particle source and the electric potential of the object. Electric fields are present between the objective lens and the object in some particle beam microscopes in order to provide a lens effect for focusing the particle beam and/or in order to reduce the kinetic energy of the particles prior to incidence on the object. In some cases, it is desirable to change the electric potential of the object in order to bring about a modified observation situation, which generates a change in contrast of the image being created. A change in contrast is brought about by virtue of electric fields at the object being modified by the modified potential of the object, which has an influence on the trajectories of back-scattered electrons and, in particular, secondary electrons and on the acceleration thereof toward a detector. As result of this, it is possible to make certain structures of the object visible in the image, which structures are not visible in a different observation situation. With a change in the electric potential of the object, there is a change in the kinetic energy with which the particles are incident on the object, and there is also a change in the electric fields between object and objective lens. Both have an influence on the focusing of the particle beam at the object, and so the user once again sets the focusing of the beam after a change in the electric potential of the object.

SUMMARY

The disclosure proposes a method for operating a particle beam microscope which makes it easier to focus the particle beam after changing the electric potential of the object. Furthermore, the disclosure proposes a particle beam microscope which makes this easing possible.

Embodiments of the disclosure provide a method for operating a particle beam microscope, which includes a setting of an electric potential of the particle source, a setting of an electric potential of an object to be examined with the particle beam microscope, a generating of a particle beam of particles emitted by the particle source, a setting of an excitation of at least one particle-optical lens, a directing of the particle beam onto the object and a focusing of the particle beam with the at least one particle-optical lens and a changing of a manipulated variable with the aid of an actuating element actuatable by a user in order to focus the particle beam at the object. To this end, a dependence between the manipulated variable and the excitation of the at least one particle-optical lens is generated or provided such that the user can change the manipulated variable by actuating the actuating element and the particle beam microscope can change the excitation of the at least one particle-optical lens on the basis of the dependence of the excitation of the at least one particle-optical lens on the manipulated variable. Therefore, by actuating the actuating element, the user can bring about a change in the excitation of the at least one particle-optical lens until the focusing of the particle beam at the object is set in a manner satisfactory for the user.

In accordance with exemplary embodiments herein, the method furthermore includes a determination of the target value of the manipulated variable in a manner dependent on the set electric potential of the particle source and the set electric potential of the object, wherein the target value of the manipulated variable, based on the dependence of the excitation on the manipulated variable, virtually corresponds to an ideal excitation of the particle-optical lens. In the case of the ideal excitation of the at least one particle-optical lens, the particle beam is focused to the best possible extent at the object. In practice, the target value, in general and, in particular, in the case of large magnifications, cannot be determined in such a way that the excitation corresponding to the target value is equal to the ideal excitation of the particle-optical lens as this is prevented by non-predictable effects during the operation of the particle beam microscope. An example of such a non-predictable effect is the strength of the magnetic field of the particle-optical lens which is generated by the excitation of the particle-optical lens and focused by the particle beam since, for example, changes in the magnetisation of pole pieces and yokes of the particle-optical lens are not created exactly proportional to changes in the excitation due to hysteresis effects. By way of example, these hysteresis effects can be caused by the magnetic reversal of domains in the magnetic material of the pole pieces and yokes. This leads to the target value of the manipulated variable only being able to be determined in such a way that it corresponds virtually, but not exactly, to the ideal excitation of the at least one particle-optical lens. Therefore, setting of the ideal focusing in a pre-calculating manner and without intervention by the user is not possible. Therefore, involvement of the user is necessary for ideal focusing of the particle beam at the object, which user changes the excitation of the at least one particle-optical lens by actuating the actuating element until the focusing is ideal.

Setting of the ideal focusing by the user may be lengthy, for example if the current excitation of the particle-optical lens differs greatly from the ideal excitation. Then, the user changes the manipulated variable again and again in an iterative procedure by actuating the actuating element in order to bring the current excitation closer to the ideal excitation, with the user however not knowing the ideal excitation or the ideal position of the actuating element, which exists on the basis of the dependence of the excitation on the manipulated variable and which corresponds to the ideal excitation. If the current excitation is very different from the ideal excitation, the user initially reduces the magnification, carry out approximate focusing, then possibly increase the magnification step-by-step and carry out focusing again in each case. Moreover, it is possible that the current excitation already virtually corresponds to the ideal excitation but that even careful actuations of the actuating element by the user lead to such strong changes in the excitation that the adjustment of the excitation worsens and does not bring it closer to the ideal excitation.

Exemplary embodiments of the method therefore provide for the dependence between the manipulated variable and the excitation, which is representable as a monotonic function depending on the manipulated variable, to be generated in such a way that the absolute value of the first derivative of the function in a value range containing the target value is smaller than in the case of values of the manipulated variable lying outside of this value range. This leads to changes in the manipulated variable caused by actuating the actuating element bringing about relatively large changes in the excitation if a difference between the current excitation and the ideal excitation or the virtually ideal excitation is large and corresponding changes in the manipulated variable bringing about a relatively small change in the excitation of the at least one particle-optical lens if the difference between the current excitation and the ideal excitation or the virtually ideal excitation is small. By this generation of the dependence between the manipulated variable and the excitation of the at least one particle-optical lens, the user can be put into the position of initially setting the excitation virtually ideally in a few iterative steps and then actually setting it ideally in a particularly precise manner.

In accordance with further exemplary embodiments, the absolute value of the first derivative of the function, by which the dependence between the manipulated variable and the excitation of the at least one particle-optical lens is representable, has a minimum at the target value of the manipulated variable.

In accordance with further exemplary embodiments, the absolute value of the second derivative of the function, by which the dependence between the manipulated variable and the excitation of the at least one particle-optical lens is representable, increases monotonically with increasing distance from the target value.

In accordance with exemplary embodiments, the actuating element is actuatable by the user in order to selectively increase or decrease the manipulated variable.

In accordance with exemplary embodiments, the method furthermore includes the generation of an image of the object with the aid of the particle beam directed onto the object. The generation of the image can be carried out repeatedly and the manipulated variable can be changed in a manner dependent on the respectively generated image. In accordance with exemplary embodiments herein, the changing of the manipulated variable is carried out on the basis of a quality of the generated image. The quality of the generated image can be determined subjectively by the user by observing the image on a display medium. However, it is also possible to automatically assess the quality of the image with the aid of computer-assisted image processing. By way of example, the quality of an image which has relatively strong contrasts can be considered to be better than that of an image which has comparatively weaker contrasts.

In accordance with exemplary embodiments, provision is made for a particle beam microscope, which includes a particle beam source for generating a particle beam, an object holder, at least one particle-optical lens, a control element outputting a control signal in a manner dependent on an actuation by a user and a controller, wherein the controller is configured to set a potential of the particle source, set a potential of the object holder, set an excitation of the at least one particle-optical lens, change a manipulated variable on the basis of the control signal, and generate a dependence between the manipulated variable and the excitation of the at least one particle-optical lens in such a way that the excitation is representable as a monotonic function dependent on the manipulated variable.

In accordance with exemplary embodiments herein, the controller is furthermore configured to determine a target value of the manipulated variable in a manner dependent on the set electric potential of the particle source and the set electric potential of the object, wherein the target value of the manipulated variable, based on the dependence of the excitation on the manipulated variable, virtually corresponds to an ideal excitation of the particle-optical lens, wherein the particle beam in the case of the ideal excitation of the at least one particle-optical lens is focused at the object. In accordance with exemplary embodiments herein, the dependence between the manipulated variable and the excitation of the at least one particle-optical lens is determined in such a way that the absolute value of the first derivative of the function, by which the dependence between the manipulated variable and the excitation of the at least one particle-optical lens is representable, in a value range containing the target value is smaller than in the case of values of the manipulated variable lying outside of this value range.

In accordance with exemplary embodiments, the particle beam microscope includes an input apparatus for entering a value for the potential of the object holder and/or an input apparatus for entering a value for the potential of the particle source.

In accordance with exemplary embodiments, the controller includes a memory which, for a multiplicity of combinations of values for the potential of the object holder, values for the potential of the particle source and possibly other parameters, such as e.g. the distance between the object and the object lens, contains a target value in each case. The target values assigned to the respective combinations of values for the potential of the object holder and values for the potential of the particle source can be determined in advance, for example experimentally or by computation.

In accordance with exemplary embodiments, the controller includes a computing device which is configured to calculate the corresponding target value on the basis of a value for the potential of the object holder and a value for the potential of the particle source. In this case, the computing device can operate software which simulates the focusing of the particle beam at the object in a manner dependent on the potential of the object holder and the potential of the particle source, possibly with the aid of heuristics.

The at least one particle-optical lens for focusing the particle beam at the object, the excitation of which is set in a manner dependent on the manipulated variable, can include a condenser lens and/or an objective lens of the particle beam microscope.

In accordance with exemplary embodiments, the particle beam microscope, for the purposes of generating images, includes a detector for detecting particles of the particle beam which have interacted with the object holdable by the object holder and/or for detecting particles and/or radiation which emanate(s) from the object on account of the particle beam incident on the object. For the purposes of generating images, the particle beam microscope can furthermore include a deflection device in order to scan the particle beam over the object. It is possible to generate the image of the object by recording a detection signal from the detector, or a signal derived from the detection signal, in a manner dependent on the position at the object at which the particle beam is incident on the latter during the scanning.

The particles of the particle beam microscope can be charged particles, such as e.g. electrons or ions, such as e.g. helium ions, and so the particle beam microscope can be an electron beam microscope or an ion beam microscope.

The particle beam microscope can also be integrated into a system which is constructed from two or more particle beam columns or particle beam microscopes, wherein the particles of the respective particle beam microscope can be electrons or different types of ions, such as e.g. He ions, Ne ions or Ga ions. Thus, for example, a first particle beam microscope of the system can be constructed as an electron beam microscope and a second particle beam microscope of the system can be constructed as an ion beam microscope. By way of example, it is also possible for both particle beam microscopes to be constructed as an ion beam microscope in each case, wherein the one ion beam microscope is, for example, a helium ion microscope and the second ion beam microscope is, for example, a neon or gallium ion microscope.

BRIEF DESCRIPTION OF THE DRAWINGS

Exemplary embodiments of the disclosure are explained in more detail below on the basis of figures, in which.

DETAILED DESCRIPTION

Figure 1:
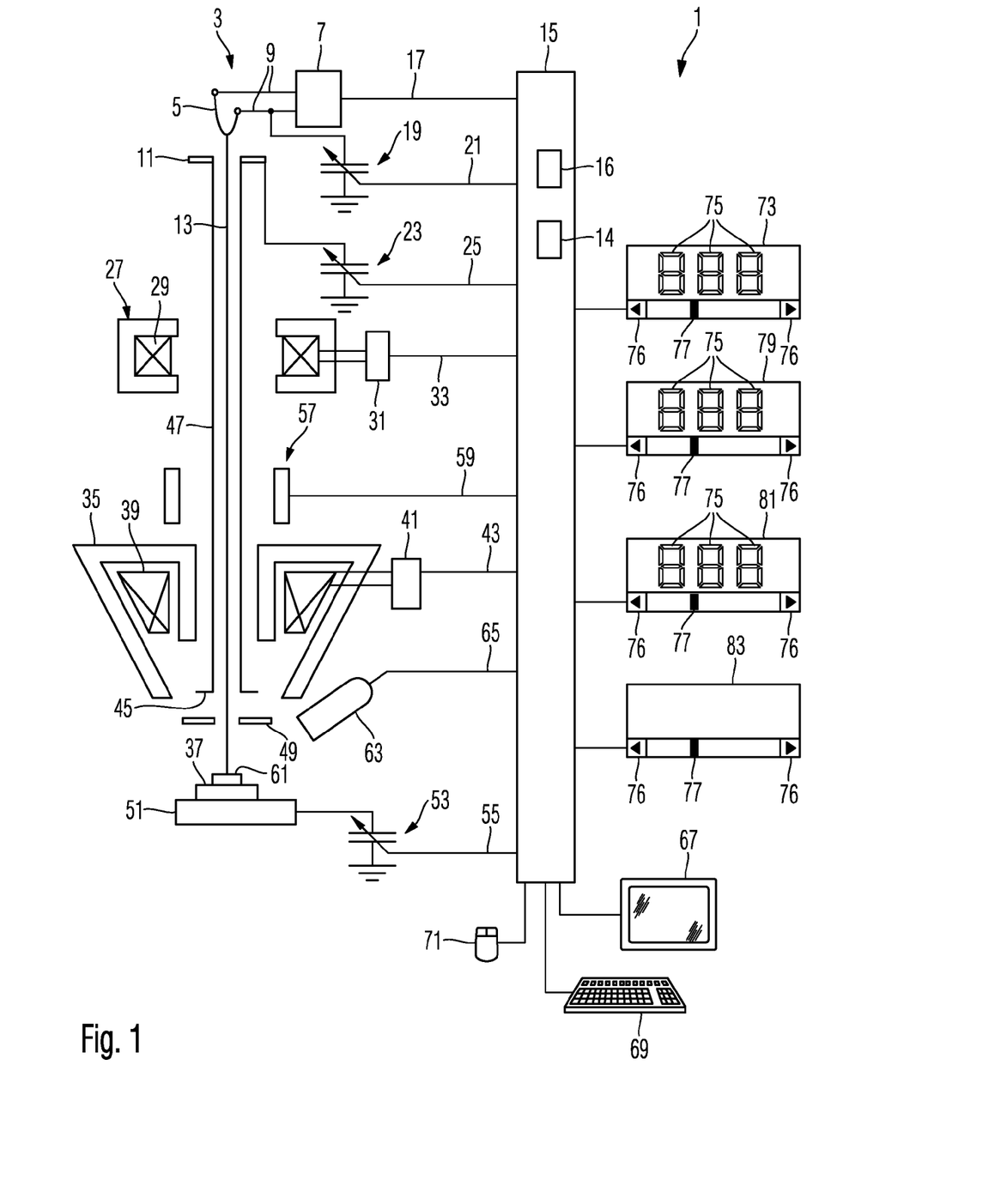
FIG. 1 shows a schematic illustration of a particle beam microscope.

FIG. 1 is a schematic illustration of a particle beam microscope 1. The particle beam microscope 1 includes a particle source 3 including a particle emitter 5 and a driver 7. By way of example, the particle emitter 5 can be a cathode heated by the driver 7 by way of lines 9, which cathode emits electrons which are accelerated away from the emitter 5 by an electrode 11 and which are shaped to form a particle beam 13. To this end, the driver 7 is controlled by a controller 15 of the particle beam microscope 1 by way of a control line 17 and an electric potential of the emitter is set by way of an adjustable voltage source 19, which is controlled by the controller 15 by way of a control line 21. An electric potential of the electrode 11 is set by way of an adjustable voltage source 23, which is likewise controlled by the controller 15 by way of a control line 25. A difference between the electric potential of the emitter 5 and the electric potential of the electrode 11 defines the kinetic energy of the particles of the particle beam 13 after passing through the electrode 11.

The particle beam 13 passes through a condenser lens 27 which collimates the particle beam 13. In the depicted example, the condenser lens 27 is a magnetic lens with a coil 29, which is excited by a current generated by an adjustable current source 31 controlled by the controller 15 by way of a control line 33.

Thereupon, the particle beam 13 passes through an objective lens 35, which focuses the particle beam at a surface of an object 37 to be examined. In the depicted example, the objective lens 35 includes a magnetic lens, the magnetic field of which is generated by a coil 39, which is excited by a current source 41 controlled by the controller 15 by way of a control line 43. The objective lens 35 furthermore includes an electrostatic lens, the electrostatic field of which is generated between one end 45 of a beam tube 47 and an electrode 49. The beam tube 47 is electrically connected to the electrode 11 and the electrode 49 can be electrically connected to the earth potential or be set to a potential different from earth via a further voltage source (not depicted in FIG. 1) controlled by the controller 15.

The object 37 is held on an object holder 51, the electric potential of which is set by way of a voltage source 53 controlled by the controller 15 by way of a control line 55. The object 37 is electrically connected to the object holder 51, and so the object 37 also has the electric potential of the object holder 51. A difference between the electric potential of the particle emitter 5 and the electric potential of the object 37 defines the kinetic energy of the particles of the beam 13 when incident on the object 37. Compared thereto, the particles may have greater kinetic energy within the beam tube 47 and when passing through the condenser lens 27 and the objective lens 35 if they are decelerated by the electrostatic field between the end 45 of the beam tube 47 and the electrode 49 and/or by an electric field between the electrode 49 and the object 37. However, it is also possible to configure the particle beam microscope 1 without beam tube 47 and electrode 49, and so the particles are decelerated or accelerated by an electric field between the electrode 11 and the object 37 prior to being incident on the object 37. Independently of the embodiment of the particle beam microscope 1 with or without beam tube 47 and independently of the embodiment and arrangement of the electrode 49, the kinetic energy of the particles when incident on the object 37 is only dependent on the difference between the potentials of the particle source 3 and of the object 37.

The particle beam microscope 1 furthermore includes a deflection device 57 which is controlled by the controller 15 by way of a control line 59 and which deflects the particle beam 13 such that the particle beam 13 can scan a region 61 on the object 37 under control of the controller 15. The particle beam microscope 1 furthermore includes a detector 63 which is positioned in such a way that particles emanating from the object 37 are incident on the detector 63.

In the illustration of FIG. 1, the detector 63 is a detector arranged next to the objective lens 35 and in the vicinity of the object. However, it is also possible for the detector to be arranged in the beam tube 47. Particularly if an electric field at the surface of the object has a decelerating effect on the incident electrons of the particle beam 13, secondary electrons leaving the object at low velocity are accelerated into the beam tube by this electric field and become detectable by the detector in the beam tube 47.

The particles emanating from the object 37 are caused by the particle beam 13 incident on the object 37. In particular, these detected particles can be particles of the particle beam 13 itself, which are scattered at the object 37, such as e.g. backscattered electrons, or they can be particles which are separated from the object 37 by the incident particle beam 13, such as e.g. secondary electrons. However, the detector 63 can also be embodied in such a way that it detects radiation, such as e.g. X-ray radiation, which is generated by the particle beam 13 incident on the object 37. Detection signals from the detector 63 are received by the controller 15 by way of a signal line 65. The controller 15 stores the data, derived from the detection signals, in a manner dependent on the current setting of the deflection device 57 during a scanning process, and so these data represent a particle-beam-microscopic image of the region 61 of the object 37. This image can be displayed by a display apparatus 67 connected to the controller 15 and observed by a user of the particle beam microscope 1.

The user can control the various functions of the particle beam microscope 1 by way of input apparatuses, which are connected to the controller 15. A keyboard 69 and a mouse 71 are depicted in an exemplary manner as input apparatuses in FIG. 1. However, further input apparatuses, such as e.g. pushbuttons or rotary knobs, may be provided. The control of some functions of the particle beam microscope 1 by the user is described in an exemplary manner below.

The electric potential of the particle source 3 is adjustable by the user. By way of example, this can be carried out by way of a rotary knob or an operating element 73 of a graphical user interface displayed on the display apparatus 67 by the controller 15. The operating element 73 includes a display of numerals 75, which represent the value of the electric potential of the particle source 3. By way of example, the numerals 75 can be entered by the user by way of the keyboard 69. Furthermore, the user can actuate buttons 76 with a mouse 71 in order to increase or decrease the electric potential of the particle source 3, or he can displace a slider 77 with the mouse in order to change the electric potential of the particle source 3. An operating element 79 corresponding to the operating element 73 is provided for setting the electric potential of the electrode 11. A further corresponding operating element 81 is provided for setting the electric potential of the object holder 51.

By way of the operating elements 73, 79 and 81, the user is able to predetermine the parameters of the particle beam microscope 1, which parameters determine the kinetic energy of the particles of the particle beam 13 when incident on the object 37 and while passing through the particle-optical lenses 27 and 35. Then, the user still sets the focusing of the particle beam 13 at the object 37. The focus of the particle beam 13 at the object 37, i.e. the size of the cross section of the particle beam 13 when incident on the object 37, limits the spatial resolution of the image generable by the particle beam 13. The focusing of the particle beam 13 at the object 37 is determined by the excitation of the particle-optical lenses, i.e. the excitation of the condenser lens 27 and the excitation of the objective lens 35. The excitation of the condenser lens 27 is determined by the strength of the current supplied to the coil 29 by the current source 31 and the excitation of the objective lens 35 is determined by the strength of the current supplied to the coil 39 by the current source 41. Here, the excitation of the condenser lens 27 can be predetermined by the controller 15, for example in a manner dependent on the kinetic energy of the particles of the beam 13, and all that can be changed by the user is the excitation of the objective lens 13 in view of the focusing of the particle beam 13 at the object. However, it is also possible that the user can change the excitation of the condenser lens 27 in order to change the focusing of the particle beam 13 at the object 37.

In the illustration of FIG. 1, an operating element 83, corresponding to the operating element 73, of the user interface is provided, by which the user can change the excitation of the objective lens 35. A manipulated variable is set by the user by way of the operating element 83. By way of example, this manipulated variable is given by a position of the slider 77 of the operating element 83 between the buttons 76 of the operating element 83. The controller converts the value of this manipulated variable into values for the excitation of the objective lens 35. The value of the excitation of the objective lens is given by the strength of the current which is generated by the current source 41 and supplied to the coil 39. A change in the manipulated variable by way of the operating element 83 is therefore converted by the controller 15 into a change in the current provided by the current source 41. To this end, there is a dependence between the manipulated variable and the excitation of the objective lens 35 in the controller. This dependence can be representable by a mathematical function. The relationship between the manipulated variable that is changeable by the user and the excitation of the objective lens is explained in more detail below on the basis of FIGS. 2 to 4.

Figure 2:
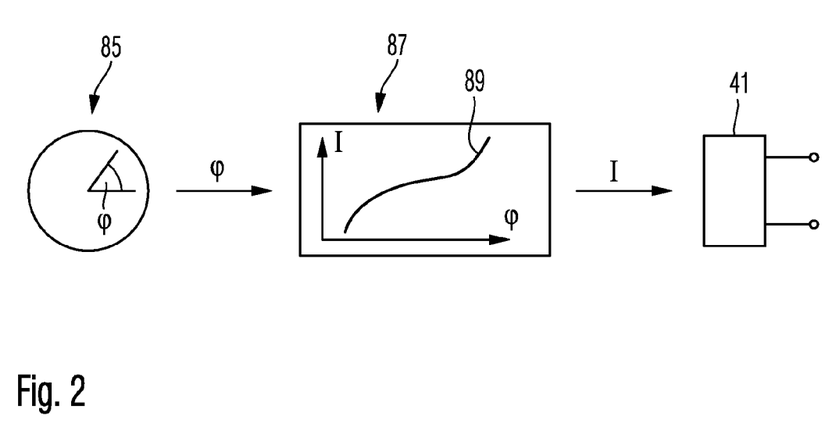
FIG. 2 shows a schematic illustration of a relationship between a control element actuatable by a user and an excitation of a particle-optical lens of the particle-beam microscope from FIG. 1.

The manipulated variable can be changed by the user by various actuating elements. FIG. 1 shows the slider 77 and the buttons 76 of the operating element 83 of the graphical user interface as actuating elements. Moreover, the user can also actuate the keys of the keyboard for changing the manipulated variable, and so these keys are also suitable actuating elements. FIG. 2 depicts a rotary knob 85 as an actuating element for changing the manipulated variable, which sets the excitation of the objective lens 35. The rotary knob 85 can be fastened to a separate control console of the controller 15 or else to the keyboard 69. The rotary knob 85 can be grasped and twisted by the user. A rotary position or a change in the rotary position of the rotary knob 85 is detected by a sensor (not depicted in FIG. 2). In the case of a rotary knob 85, the manipulated variable modified by the user by actuating the actuating element 85 is an angle $\varphi$, which represents a rotary position of the rotary knob 85. The angle $\varphi$ is entered by the controller 15 into an actuator 87 realized in the controller 15, which actuator outputs a value of the current I in a manner dependent on the entry of the angle $\varphi$, which current is supplied to the coil 39 of the objective lens 35 from the current source 41. The actuator 87 provides a dependence between the manipulated variable, which is the angle $\varphi$ in the depicted example, and the excitation of the objective lens or the current I supplied to the objective lens. This dependence is depicted in FIG. 2, namely by a line 89 which represents the profile of the function. The function is the function $I(\varphi)$ of the current I depending on the angle $\varphi$.

The objective lens 35 is excited for obtaining an ideal focusing of the particle beam 13 at the object 37 changes when the electric potential of the object 37 is adjusted. Therefore, different values of the ideal excitation of the objective lens 35 or of the currents I supplied to the objective lens 35 emerge for different values of the electric potential of the object 37. However, the ideal values of the excitation or of the current cannot be calculated in advance by the controller 15 on account of e.g. hysteresis effects and therefore are set by the user by actuating the actuating element 85. However, in order to simplify this, the controller 15 generates different dependencies between the manipulated variable ($\varphi$) and the excitation (I) of the objective lens 35 for different values of the electric potential of the object 37. This is depicted in an exemplary manner in FIG. 3.

Figure 3:
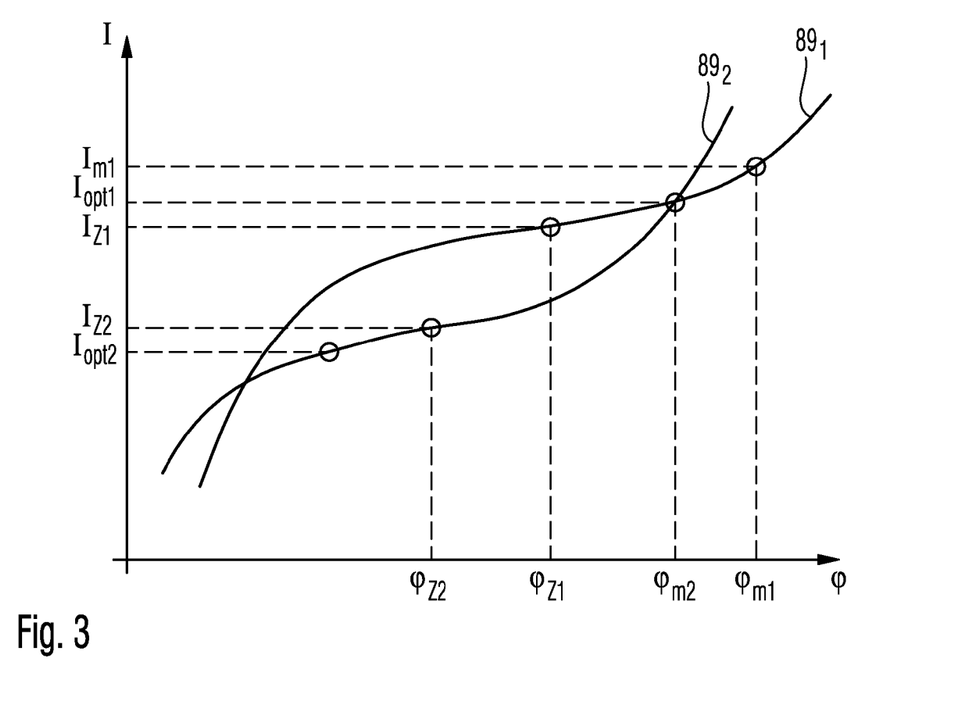
FIG. 3 shows a graph which represents the dependencies between a manipulated variable and the excitation of the particle-optical lens.

In this case, the assumption is made that the instantaneous excitation of the objective lens 35 is given by an instantaneous current $I_{m1}$ and the electric potential of the object 37 is to be set to a first value. The ideal excitation of the objective lens 35 in the case of a current $I_{opt1}$ supplied to the objective lens 35 is obtained at the first value of the electric potential of the object 37.

The ideal current $I_{opt1}$ cannot be calculated in advance by the controller 15. However, the controller can determine a target current $I_{Z1}$, which, at the given first electric potential of the object 37, approximately or virtually corresponds to the ideal current $I_{opt1}$. For the given first electric potential of the object 37, the controller generates the dependence between the manipulated variable ($\varphi$) and the excitation (I) of the objective lens 35 in such a way that the excitation (I) is representable as a monotonic function depending on the manipulated variable ($\varphi$). For the first electric potential of the object 37 assumed in FIG. 3, the function representing the dependence is depicted by a line $89_1$. At the value $\varphi_{Z1}$ of the argument $\varphi$ thereof, the function $89_1$ has the functional value $I_{Z1}$ and it is furthermore selected in such a way that it extends through the point $I_{m1}(\varphi_{m1})$, which represents the instantaneous current at the instantaneous position of the actuating element or the instantaneous value of the manipulated variable. The function $89_1$ is designed in such a way that the gradient thereof at the target value $\varphi_{Z1}$ is smaller in terms of absolute value than in the case of values of the argument $\varphi$, which differ from $\varphi_{Z1}$.

Figure 4:
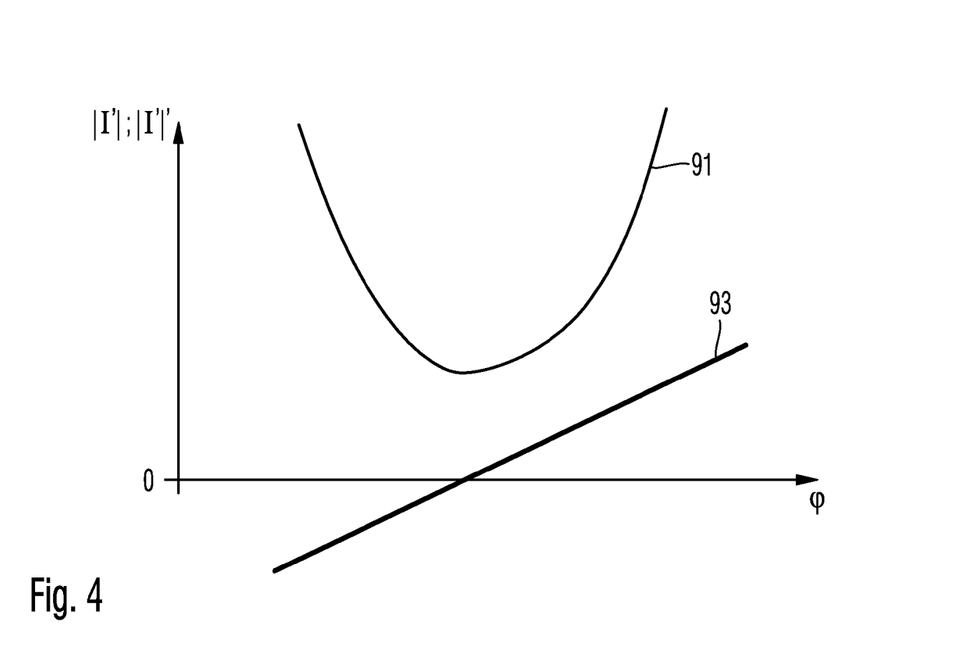
FIG. 4 shows a graph which represents the derivatives of the functions shown in the graph from FIG. 3.

FIG. 4 is a graph which shows the absolute value of the first derivative of the function $89_1$ and the derivative of the absolute value of the first derivative of the function $89_1$. A line 91 in FIG. 4 represents the absolute value of the first derivative $|I'(\varphi)|$ of the function $89_1$ and a line 93 in FIG. 4 represents the derivative of the absolute value of the derivative $|I'(\varphi)|'$ of the function $89_1$ in FIG. 3. In the example of FIG. 3, the function $89_1$ is a monotonically increasing function. However, it is also possible for it to be a monotonically decreasing function. However, the absolute value of the first derivative $|I'(\varphi)|$ depicted by the line 91 in FIG. 4 has a minimum at the target value $\varphi_{Z1}$ of the manipulated variable $\varphi$. Furthermore, the derivative of the absolute value $|I'(\varphi)|'$ represented by the line 93 in FIG. 4 is a monotonically increasing function.

The user can now change the manipulated variable, proceeding from the instantaneous value $\varphi_{m1}$, by actuating the actuating element, wherein the controller changes the current in a manner dependent on the position of the actuating element according to the stipulation of the function $89_1$. The assumption is now made that the user, within the scope of his assessment of the quality of the recorded images, finds the ideal excitation of the objective lens at the current $I_{opt1}$ and the corresponding position $\varphi_{m2}$ of the actuating element.

Using this setting of the ideal excitation of the objective lens, the user can thereupon undertake a number of examinations and, for example, obtain several particle-microscopic recordings at various magnifications.

An example for selecting the function $89_1$ is explained below. Here, the following approach is selected for the function $I(\varphi)$:

$$I(\varphi)=I_{Z1}+(\varphi-\varphi_{Z1})*(Q+R\tan h^2(S*(\varphi-\varphi_{Z1}))) \quad (1)$$

Here, Q is a constant which equals the gradient of the function $I(\varphi)$ at the value $\varphi_{Z1}$, i.e. $Q=I'(\varphi_{Z1})$ applies. Here, Q is selected as a function of the set magnification V according to the approach $Q=Q(V)=Qv*V^{-1}$, where Qv is a constant determined experimentally in such a way that precisely finding the ideal setting is possible. In Equation (1), R and S are likewise constants, the values of which can be determined in a manner dependent on $I_{m1}$, $I_{Z1}$, $\varphi_{m1}$, $\varphi_{Z1}$ in such a way, that the following applies: $I(\varphi_{m1})=I_{m1}$ and $I'(\varphi_z+D)=2*Q$, where D is a constant which, in turn, can be determined experimentally in such a way that precisely finding the ideal setting is possible.

The function $I(\varphi)$ can, in a manner dependent on $\varphi$, also be defined in a piecewise manner such that it can change the character thereof in a manner dependent on $\varphi$. An example herefor is the approach $I(\varphi)=I_{m1}+(\varphi-\varphi_{m1})*I'(\varphi_{m1})$ for $|\varphi-\varphi_{Z1}|>|\varphi_{m1}-\varphi_{Z1}|$ and for $|\varphi-\varphi_{Z1}|\leq|\varphi_{m1}-\varphi_{Z1}|$ in accordance with the above Equation (1).

Furthermore, the function $I(\varphi)$ can be modified as soon as a specific criterion has occurred. By way of example, the behaviour according to Equation (1) above can be modified to $I(\varphi)=I_{Z1}+(\varphi-\varphi_{Z1})*Q$, as soon as $\varphi=\varphi_{Z1}$ was reached once.

The selection of the approach for the function $I(\varphi)$ is in this case not restricted to the embodiments above. A multiplicity of different suitable approaches are possible, wherein each approach may contain constants which can be determined experimentally in such a way that precisely finding the ideal setting is possible.

By way of example, in Equation (1), the expression $\tan h^2(x)$ can be replaced by $x^2/(1+x^2)$.

The assumption is now made that the electric potential of the object is intended to be set to a second value, different from the first value, in order to vary the contrast of various structures of the object relative to one another.

The ideal excitation of the objective lens 35 in the case of a current $I_{opt2}$ supplied to the objective lens 35 is obtained at the second value of the electric potential of the object 37. Once again, the controller 15 cannot calculate this ideal current $I_{opt2}$ in advance. However, similar to the case above, a target current $I_{Z2}$ is determined, which, at the given second electric potential of the object 37, approximately or virtually corresponds to the ideal current $I_{opt2}$. The controller generates a new dependence between the manipulated variable ($\varphi$) and the excitation (I) of the objective lens 35 for the given second electric potential, in a manner as described above. This dependence is once again designed in such a way that the excitation (I) is representable by a monotonic function depending on the manipulated variable ($\varphi$). In FIG. 3, this function is depicted by a line $89_2$. At the value $\varphi_{Z2}$ of the argument $\varphi$ thereof, the function $89_2$ has the functional value $I_{Z2}$ and it is furthermore selected in such a way that it extends through the point $I_{opt1}(\varphi_{m2})$, which represents the instantaneous current at the instantaneous position of the actuating element or the instantaneous value of the manipulated variable. The function $89_2$ is designed in such a way that the gradient thereof at the target value $\varphi_{Z2}$ is smaller than in the case of values of the argument $\varphi$, which differ from $\varphi_{Z2}$.

The user can now change the manipulated variable, proceeding from the instantaneous value $\varphi_{m2}$, by actuating the actuating element, wherein the controller changes the current in a manner dependent on the position of the actuating element according to the stipulation of the function $89_2$. The assumption is now made that the user, within the scope of his assessment of the quality of the recorded images, finds the ideal excitation of the objective lens at the current $I_{opt2}$. The user can once again undertake a number of examinations with this setting of the ideal excitation of the objective lens.

Such a selection of the dependence between the manipulated variable ($\varphi$) and the excitation (I) of the particle-optical lens depending on the electric potential of the object has the following advantages: If the current excitation of the objective lens is very different from the ideal excitation of the objective lens, which is currently not known precisely, then small actuations of the actuating element by the user lead to a quick approach to the ideal excitation on account of the large gradient of the function. Then, on account of the small gradient of the function in the vicinity of the ideal excitation, if the current excitation approximately corresponds to the ideal excitation, it is possible to set the ideal excitation precisely by actuating the actuating element on account of the smaller gradient of the function.

The approximate values ($I_{Z1}$, $I_{Z2}$) for the ideal excitation ($I_{opt1}$, $I_{opt2}$) can be calculated, by the controller 15 using a computing device 14, in a manner dependent on the electric potential of the object, for example by using as a basis a physical model of the particle beam system or heuristically obtained functions. Furthermore, it is possible, for different electric potentials of the object, to store experimentally obtained approximate values for the ideal excitation in a memory 16 of the controller 15. Since, in addition to the electric potential of the object, the focusing of the particle beam also depends on the electric potential of the particle source, the latter can also be taken into account in the approximate determination of the ideal excitation.

Figure 5:
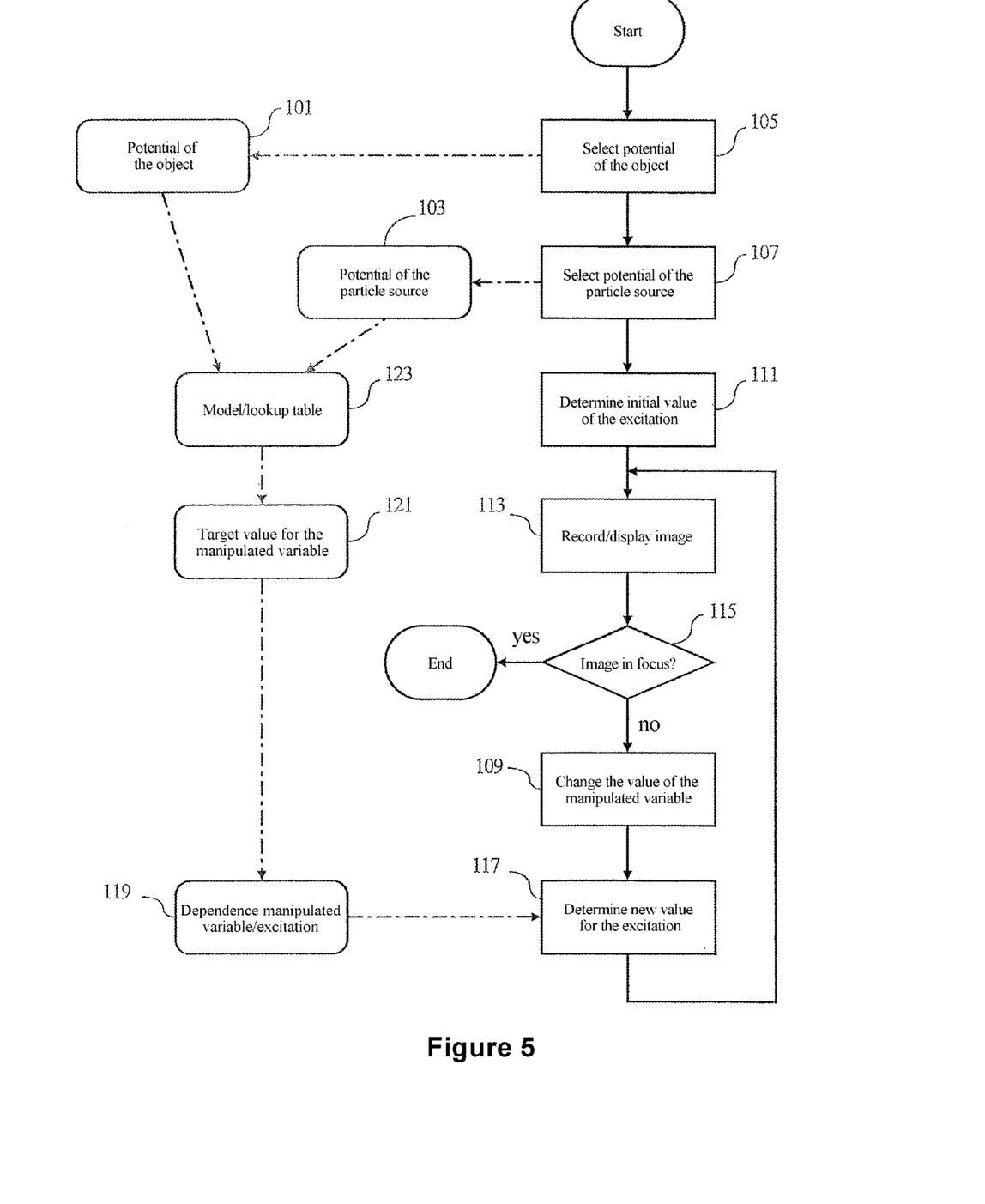
FIG. 5 shows a flowchart for explaining a method for operating the particle beam microscope from FIG. 1.

The method for setting the excitation of the objective lens 35 of the particle beam microscope 1 is once again explained below in synoptic fashion on the basis of FIG. 5. FIG. 5 shows a flowchart of a method for operating a particle beam microscope. The method serves for recording particle-beam-microscopic images of an object. To this end, the object is positioned in a suitable manner relative to the particle beam microscope and a multiplicity of settings have to be made at the particle beam microscope. Some of these settings can be made by the user, while other settings can be calculated independently by the controller of the particle beam microscope. There are also dependencies between the various settings such that a change in one setting may have as a consequence a change in a different setting. Examples of settings which are typically made by the user are the setting of a beam current of the particle beam or a magnification of the generated image. The magnification specifies the lateral extent of the region of the object depicted in a generated image (cf. 61 in FIG. 1). The size of this region defines a maximum deflection of the particle beam during scanning. This maximum deflection is an example of a setting which the controller can calculate and carry out independently after the user has set the desired magnification.

Only three settings are relevant to the method as depicted in the flowchart of FIG. 5. The measures for setting these are described below. Other settings which are usually made for operating the particle beam microscope are not described below.

The settings include the settings for the potential of the particle source, the potential of the object and the excitation of at least one particle-optical lens of the particle beam microscope in such a way that the particle beam is ideally focused at the object.

Depending on the type and composition of the examined object, it may be desirable to select different settings for the electric potential of the particle source and the electric potential of the object. The properties with which certain structures of the object become visible in the image change depending on these settings.

The two settings which are relevant in the described method and which can be made by the user are the potential of the object (101) and the potential of the particle source (103). These settings are made by the user in steps 105 and 107. Since the difference between the potentials of the object and of the particle source determine the impact energy of the particles on the object, it is alternatively also possible for the user to adopt one setting for the impact energy of the particles at the object and one for the electric potential of the object and for the controller to calculate and set the electric potential of the particle source.

After the potentials of the particle source and the object are selected, the excitation of the at least one particle-optical lens is set in such a way that the particle beam is focused at the object as ideally as possible. The ideal setting of the excitation of the at least one particle-optical lens can only be calculated approximately by the controller of the particle beam microscope since the focusing is influenced by parameters which are not sufficiently well known, which depend on the history of the operation of the particle beam microscope or which are influenced by hysteresis effects. Therefore, the precise setting of the excitation of the at least one particle-optical lens is ultimately brought about by the user by virtue of him changing a manipulated variable, on which the excitation of the at least one particle-optical lens depends, in an iterative process by actuating an actuating element in a step 109.

After selecting the electric potentials of the object and the particle beam source in steps 105 and 107, the controller therefore determines an initial value of the excitation of the at least one particle-optical lens in a step 111. By way of example, this initial value can be selected in a manner dependent on the impact energy of the particles at the object and/or in a manner dependent on other parameters. The initial value can also equal an ideal setting of the excitation found previously for a different setting of the electric potential of the object. After setting the excitation of the at least one particle-optical lens to the initial value, a repeating process is run through, in which a particle-beam-microscopic image is recorded and depicted by scanning the object with the current setting of the excitation of the at least one particle-optical lens in a step 113. A decision is made in step 115 as to whether the image is sufficiently in focus. This decision can be made subjectively by the user by observing the image. However, it is also possible to carry out this decision on the basis of objective criteria, which are determined automatically by analysing the particle-beam-microscopic image. By way of example, a measure for a contrast of the image or a sharpness of the image can be determined by various conventional algorithms. If it is determined in step 115 that the image is sufficiently in focus, the iterative process is aborted and the current setting of the excitation of the at least one particle-optical lens is capped for recording further images. To the extent that the decision in step 115 is carried out according to the stipulation of the user, the latter can actuate an operating element, such as e.g. a keyboard or a mouse or a pushbutton or the like, in order to bring about the end of the iterative process and adopt the current excitation or focusing for further following work steps.

If the decision is made in step 115 that a further improvement in the focusing should be possible, the value of the manipulated variable, on which the excitation of the at least one particle-optical lens is dependent, is modified in step 109. The value for the manipulated variable can be changed by the user by actuating an actuating element which, for example, can be realized as a rotary knob, keys of the keyboard or one or more operating elements of a graphical user interface. Depending on the new value of the manipulated variable modified in step 109, the controller determines a new value for the excitation of the at least one particle-optical lens in a step 117. This new value is then used as a current value of the excitation when the method is continued with step 113, in which a new image of the object is recorded and depicted. Thereupon, another decision can be made in step 115 as to whether or not a sufficiently good setting was found.

In order to determine the new value for the excitation in a manner dependent on the modified value of the manipulated variable in step 117, the controller uses a dependence between the manipulated variable and the excitation of the at least one particle-optical lens, which dependence is generated depending (119) on the potential of the particle source (103) and the potential of the object (101). In order to generate the dependence (119) between the manipulated variable and the excitation, the controller initially determines a target value of the manipulated variable (121) with the aid of a physical or heuristic model and/or a lookup table (123). In this determination, the potential of the object (101) and the potential of the particle source (103) are input parameters and the target value of the manipulated variable (121) is the output parameter. The target value of the manipulated variable (121) is determined by the model with a lookup table (123) in such a way that the excitation, which corresponds to the target value of the manipulated variable in accordance with the dependence of the excitation on the manipulated variable, of the at least one particle-optical lens approximately corresponds to the ideal excitation of the particle-optical lens, as was explained above on the basis of FIG. 3.

Furthermore, the dependence between the manipulated variable and the excitation of the at least one particle-optical lens is generated in such a way that it is representable as a monotonic function dependent on the manipulated variable. Moreover, the dependence is determined in such a way that the function which is representable by the dependence has a profile of the absolute value of the first derivative thereof which is smaller in a region around the target value than outside of this region. By way of example, this can be achieved by virtue of the function being selected in such a way that the absolute value of the first derivative thereof has a minimum at the target value. Moreover, the function can be selected in such a way that the absolute value of the second derivative thereof increases monotonically with increasing distance from the target value in a region around the target value.

The generation and provision of the dependence between the manipulated variable and the excitation of the at least one particle-optical lens allows the user to adopt the ideal setting of the excitation in a quick and precise manner.

Above, embodiments of a method for operating a particle beam microscope were described in an exemplary manner on the basis of an electron microscope. However, this method can also be performed using different particle beam microscopes. Examples of this are microscopes which use particle beams with ions, such as for example He ions.

Furthermore, the particle beam microscope can be integrated into system which contains one or more further particle beam instruments. By way of example, the further particle beam instrument can generate a particle beam which can be directed onto the same region of an object which is also imaged by the particle beam microscope. The particle beam of the further particle beam instrument can be formed by particles of a particle type which differs from the particle type of the particles of the particle beam of the particle beam microscope. By way of example, the particles of the particle beam of the further particle beam instrument can include electrons, Ga ions, Au ions, Si ions, He ions, Ne ions, Ar ions, positrons and the like. The particle beam of the further particle beam instrument can be used to process the object by virtue of material being removed from the object, or material being deposited on the object, there by the effect of the particles on the object. Such processing of the object can be assisted by the supply of a suitable process gas.

What is claimed is:

1. A method, comprising:
   setting an electric potential of a particle source of a particle beam microscope;
   setting an electric potential of an object;
   generating a particle beam of particles emitted by the particle source;
   directing the particle beam onto the object;
   setting an excitation of a particle-optical lens;
   focusing the particle beam using the particle-optical lens;
   generating a dependence between a variable and the excitation of the particle-optical lens so that the excitation of the particle-optical lens is representable as a monotonic function dependent on the variable;
   using an actuating element to change the variable, the actuating element being actuatable by a user to focus the particle beam at the object; and
   determining a target value of the variable in a manner dependent on the set electric potential of the particle source and the set electric potential of the object,
   wherein:
      based on the dependence of the excitation on the variable, the target value of the variable virtually corresponds to an ideal excitation of the particle-optical lens;
      in the case of the ideal excitation of the particle-optical lens, the particle beam is focused at the object; and
      the dependence between the variable and the excitation of the particle-optical lens is generated so that an absolute value of the first derivative of the function in a value range containing the target value is less than in the case of values of the variable lying outside of this value range.

2. The method of claim 1, wherein the absolute value of the first derivative of the function has a minimum at the target value.

3. The method of claim 1, wherein the absolute value of the second derivative of the function increases monotonically with increasing distance from the target value.

4. The method of claim 1, further comprising actuating the actuating element to selectively increase the variable.

5. The method of claim 1, further comprising actuating the actuating element to selectively decrease the variable.

6. The method of claim 1, further comprising using the particle beam directed at the object to generate an image of the object.

7. The method of claim 6, further comprising changing the variable based a quality of the generated image of the object.

8. The method of claim 1, wherein the particle beam microscope comprises an electron microscope.

9. A particle beam microscope, comprising:
a particle source configured to generate a particle beam;
an object holder;
a particle-optical lens;
a control element configured to output a control signal dependent on actuation by a user;
a controller configured to:
set a potential of the particle source;
set a potential of the object holder;
set an excitation of the particle-optical lens;
change a variable on the basis of the control signal;
generate a dependence between the variable and the excitation of the particle-optical lens so that the excitation is representable as a monotonic function dependent on the variable; and
determine a target value of the variable dependent on the set electric potential of the particle source and the set electric potential of the object holder,
wherein:
based on the dependence of the excitation on the variable, the target value of the variable virtually corresponds to an ideal excitation of the particle-optical lens;
in the case of the ideal excitation of the particle-optical lens, the particle beam is focused at an object holdable by the object holder; and
the dependence between the variable and the excitation is determined so that the absolute value of the first derivative of the function in a value range containing the target value is less than in the case of values of the variable lying outside of this value range.

10. The particle beam microscope of claim 9, further comprising an input apparatus configured to enter a value for the potential of the object holder.

11. The particle beam microscope of claim 9, further comprising an input apparatus configured to enter a value for the potential of the particle source.

12. The particle beam microscope of claim 9, wherein the controller comprises a memory containing a target value for each case for a multiplicity of combinations of values for the potential of the object holder and values for the potential of the particle source.

13. The particle beam microscope of claim 9, wherein the controller comprises a device configured to calculate the target value on the basis of a value for the potential of the object holder and a value for the potential of the particle source.

14. The particle beam microscope of claim 9, wherein the particle-optical lens comprises a condenser lens of the particle beam microscope.

15. The particle beam microscope of claim 9, wherein the particle-optical lens comprises an objective lens of the particle beam microscope.

16. The particle beam microscope of claim 9, further comprising a detector configured to detect particles of the particle beam which have interacted with the object when held by the object holder.

17. The particle beam microscope of claim 9, further comprising a detector configured to detect particles and/or radiation which emanates from the object when held by the object holder, wherein the particles and/or the radiation are generated via an interaction of the particle beam with the object.

18. The particle beam microscope of claim 9, further comprising a deflection device configured to scan the particle beam over the object when held in the object holder.

19. The particle beam microscope of claim 9, wherein the particle beam microscope comprises an electron microscope.

20. A method, comprising:
directing a particle beam generated by a particle source of a particle beam microscope onto an object;
using an excitation of a particle-optical lens of the particle beam microscope to focus the particle beam;
generating a dependence between a variable and the excitation of the particle-optical lens so that the excitation of the particle-optical lens is representable as a monotonic function dependent on the variable;
using an actuating element to change the variable to focus the particle beam at the object, the actuating element being actuatable by a user to focus the particle beam at the object; and
determining a target value of the variable in a manner dependent on an electric potential of the particle source and an electric potential of the object,
wherein:
based the dependence of the excitation on the variable, the target value of the variable virtually corresponds to an ideal excitation of the particle-optical lens;
in the case of the ideal excitation of the particle-optical lens, the particle beam is focused at the object; and
the dependence between the variable and the excitation of the particle-optical lens is generated so that an absolute value of the first derivative of the function in a value range containing the target value is less than in the case of values of the variable lying outside of this value range.

* * * * *

UNITED STATES PATENT AND TRADEMARK OFFICE
CERTIFICATE OF CORRECTION

PATENT NO.         : 10,062,542 B2  
APPLICATION NO.    : 15/010046  
DATED              : August 28, 2018  
INVENTOR(S)        : Dirk Preikszas

Page 1 of 1

It is certified that error appears in the above-identified patent and that said Letters Patent is hereby corrected as shown below:

In the Claims

Column 16, Line 40, in Claim 20, delete "the" and insert -- on the --.

Signed and Sealed this  
Second Day of April, 2019

Andrei Iancu  
*Director of the United States Patent and Trademark Office*